United States Patent
Wang et al.

(10) Patent No.: US 9,344,046 B2
(45) Date of Patent: May 17, 2016

(54) DIGITAL CLASS-D AMPLIFIER WITH ANALOG FEEDBACK

(71) Applicant: Broadcom Corporation, Irvine, CA (US)

(72) Inventors: Zhengyu Wang, Irvine, CA (US); Iuri Mehr, Irvine, CA (US); Jungwoo Song, Irvine, CA (US); Xicheng Jiang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 180 days.

(21) Appl. No.: 14/144,262

(22) Filed: Dec. 30, 2013

(65) Prior Publication Data
US 2015/0180430 A1    Jun. 25, 2015

Related U.S. Application Data

(60) Provisional application No. 61/919,333, filed on Dec. 20, 2013.

(51) Int. Cl.
*H03F 3/217*    (2006.01)

(52) U.S. Cl.
CPC .............. *H03F 3/2175* (2013.01); *H03F 3/217* (2013.01); *H03F 2200/351* (2013.01)

(58) Field of Classification Search
USPC ......................................... 330/10, 207 A, 251
See application file for complete search history.

(56) References Cited

U.S. PATENT DOCUMENTS

| | | | |
|---|---|---|---|
| 6,373,334 | B1 | 4/2002 | Melanson |
| 2013/0127531 | A1 | 5/2013 | Lesso |

OTHER PUBLICATIONS

Extended Search Report received for European Patent Application No. 14004176.5, mailed on May 15, 2015, 3 pages.

*Primary Examiner* — Hieu Nguyen
(74) *Attorney, Agent, or Firm* — Fiala & Weaver P.L.L.C.

(57) ABSTRACT

Methods, systems, and apparatuses for detecting and suppressing analog error in an output stage of a digital class-D amplifier are described. In embodiments, the digital class-D amplifier includes a PWM stage, an output stage, and a feedback circuit. The PWM stage receives the signal difference between an input digital signal and a feedback digital signal, generates a digital pulse-width modulated (PWM) signal based thereon, and provides the digital PWM signal as a first component of the digital feedback signal. The output stage receives the digital PWM signal and generates an analog output signal for driving a load responsive to the digital PWM signal. The feedback circuit combines an analog representation of the PWM signal and the analog output signal to generate a second component of the digital feedback signal.

20 Claims, 11 Drawing Sheets

DIGITAL CLASS-D AMPLIFIER WITH ANALOG FEEDBACK

CROSS REFERENCE TO RELATED APPLICATION

This application claims priority to the following provisional application, which is incorporated by reference herein: U.S. Provisional Patent Application No. 61/919,333, filed Dec. 20, 2013.

BACKGROUND OF THE INVENTION

1. Field of the Invention

The present invention relates to audio amplifiers, and in particular to digital class-D amplifiers.

2. Background Art

Conventional digital class-D amplifiers typically include a PWM stage, an output stage, and a demodulation stage. The modulation stage usually employs pulse-width modulation to generate a digital pulse-width modulated (PWM) signal, which comprises two values: high and low. The PWM signal results from a comparison operation that compares an input signal and a high frequency ramping or triangular carrier waveform. The PWM signal contains the frequency content of both the input signal and the carrier waveform. Within each period of the carrier, the duty ratio of the PWM signal is proportional to the amplitude of the input signal. The output stage typically includes power transistors, for example, metal-oxide-semiconductor-field-effect transistors (MOSFETs) that are driven by the PWM signal. The output stage switches between positive and negative power supplies to produce a train of voltage pulses that represents an amplified version of the input signal. In the demodulation stage, the amplified PWM pulse train may be passed through a low-pass filter to recover the input signal and filter out the carrier signal.

Digital class-D amplifiers are popular in applications that require a compact size and low power consumption. This is because digital class-D amplifiers have higher efficiencies due to the power transistors in comparison to linear amplifiers, such as class-A, B or AB amplifiers. In other words, most of the power supplied to a digital class-D amplifier is delivered to the load. Thus, the digital class-D amplifier dissipates much less power than a linear amplifier and therefore does not require the cooling measures (e.g., heat sinks) that the linear amplifier requires. Digital Class-D amplifiers may therefore be favored over linear amplifiers because of higher efficiencies, lower power consumption, and smaller sizes.

However, conventional digital class-D amplifiers may suffer from poor power supply rejection and poor distortion. Sometimes a feedback loop is used to decrease noise and distortion in a digital class-D amplifier. However, the output stage is not included in the feedback loop of the traditional digital class-D amplifier. Thus, the noise and distortion introduced in the output stage is not attenuated. Conventional digital class-D amplifiers may also suffer from output stage gain variation due to the power supply variation.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
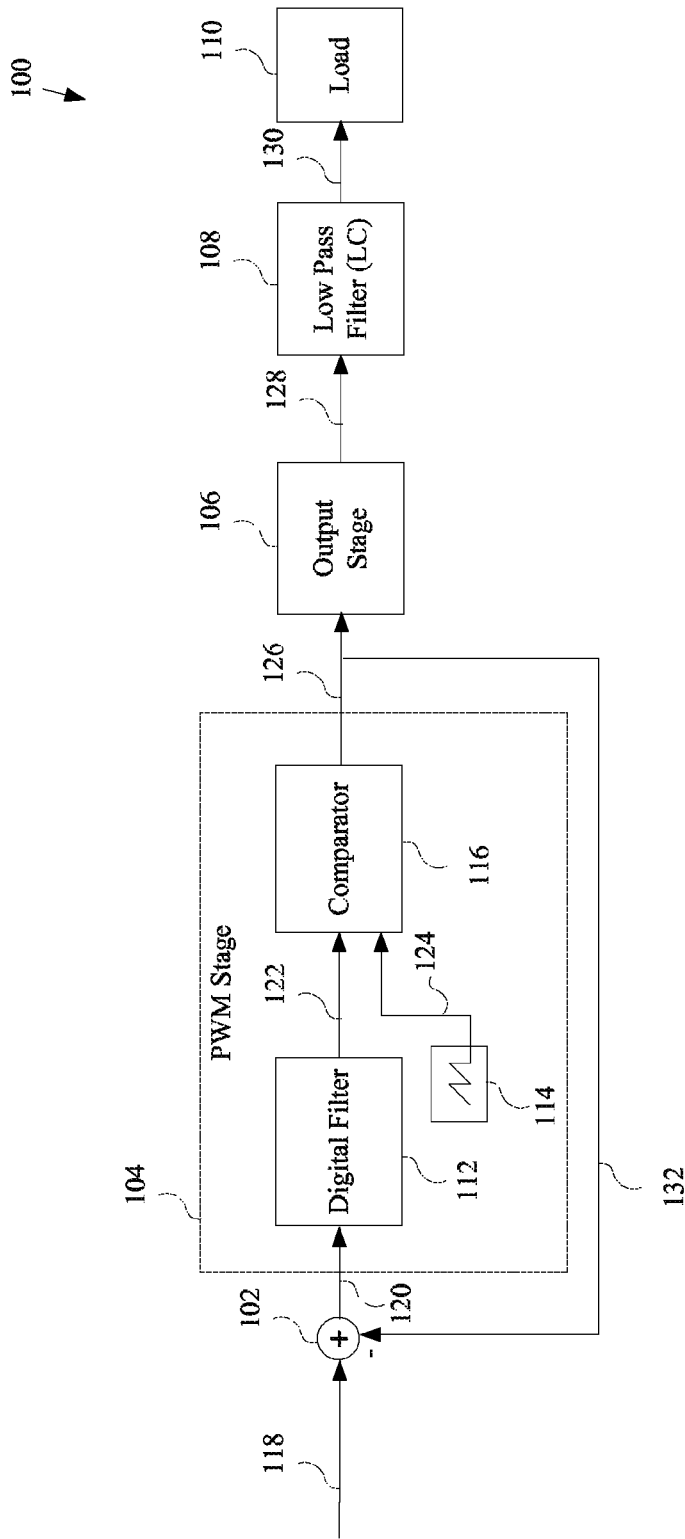
FIG. 1 is a block diagram of a conventional class-D amplifier.

The present invention will now be described with reference to the accompanying drawings. In the drawings, like reference numbers indicate identical or functionally similar elements. Additionally, the left-most digit(s) of a reference number identifies the drawing in which the reference number first appears.

BRIEF SUMMARY

Methods, systems, and apparatuses are described for detecting and suppressing analog error in an output stage of a digital class-D amplifier substantially as shown in and/or described herein in connection with at least one of the figures, as set forth more completely in the claims

DETAILED DESCRIPTION OF THE INVENTION

I. Introduction

The following detailed description discloses numerous example embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Methods, systems, and apparatuses for detecting and suppressing analog error (e.g., noise, disturbance, non-linearities) in an output stage of a digital class-D amplifier are described herein. In accordance with certain embodiments, the digital class-D amplifier includes a first combiner, a digital loop, an output stage and a feedback circuit. The first combiner is operable to combine a digital input signal with a digital feedback signal to generate a first combined signal. The digital loop is operable to receive the first combined signal and to generate a digital pulse-width modulated (PWM) signal based thereon and to provide the PWM signal as a first component of the digital feedback signal. The output stage is operable to receive the digital PWM signal and to generate an analog output signal for driving a load responsive to the digital PWM signal. The feedback circuit includes a digital to analog converter (DAC) operable to convert the digital PWM signal to an analog PWM signal, a second combiner operable to combine the analog PWM signal and the analog output signal to generate a second combined signal, and an analog to digital converter (ADC) operable to convert the second combined signal to a digital form to generate a second component of the digital feedback signal.

In accordance with certain embodiments, the first and second components of the digital feedback signal may be combined and then subtracted from the digital input signal at the first combiner. In accordance with further embodiments, the first and second components of the digital feedback signal may be subtracted as individual feedback signals from the digital input signal at the first combiner.

The aforementioned feedback circuit enables analog error introduced by the output stage to be detected and suppressed, thereby resulting in improved power supply rejection. In accordance with further embodiments, the digital class-D amplifier may be configured such that the gain of the output stage is insensitive to the accuracy of the power supply value. Due to the improvement in power supply rejection and the output stage gain being independent of the power supply value, it is possible to connect the output stage directly to a battery instead of a low-dropout (LDO) regulator. In addition, digital process scaling may be used to reduce area and power of the digital class-D amplifier because of its highly digital nature.

II. Conventional Digital Class-D Amplifier

FIG. 1 is a block diagram of a conventional digital class-D amplifier 100. Digital class-D amplifier 100 includes a number of interconnected elements including a combiner 102, a pulse-width modulation stage 104, an output stage 106, a low pass filter 108, and a load 110. These elements are described as follows.

In operation, combiner 102 receives an input signal 118. Input signal 118 may comprise a digital representation of an audio signal. Input signal 118 is combined with a feedback signal 132, which is the output signal of comparator 126, to generate a combined signal 120.

Pulse-width modulation stage 104 converts combined signal 120 received from combiner 102 into a pulse-width modulated (PWM) signal 126. Pulse-width modulation stage 104 includes a digital filter 112, a triangle wave generator 114, and a comparator 116. Combined signal 120 contains input signal 118 information and feedback signal 132 information, which includes input signal 118 information and noise introduced by pulse-width modulated stage 104. Combined signal 120 is input into digital filter 112. Digital filter 112 integrates combined signal 120 to generate filtered signal 122. Comparator 116 compares filtered signal 122 with a digital triangle waveform 124 generated by triangle wave generator 114 at a fixed frequency, $f_{osc}$. The output of comparator 116 is PWM signal 126, which toggles at the rate of $f_{osc}$. PWM signal 126 contains the frequency content of both combined signal 120 and triangle waveform 124. PWM signal 126 is fed back to the forward path as digital feedback signal 132.

Output stage 106 produces an amplified phase-reversed PWM pulse train (including power supply noise) as output signal 128. Output signal 128 is passed to low pass filter 108, which may be an LC filter that includes an inductor (L) and a capacitor (C). Low pass filter 108 may recover input signal 118 while rejecting noise. The output of low pass filter 108 is output signal 130. Output signal 130 is passed to load 110, which may be a speaker.

Figure 2:
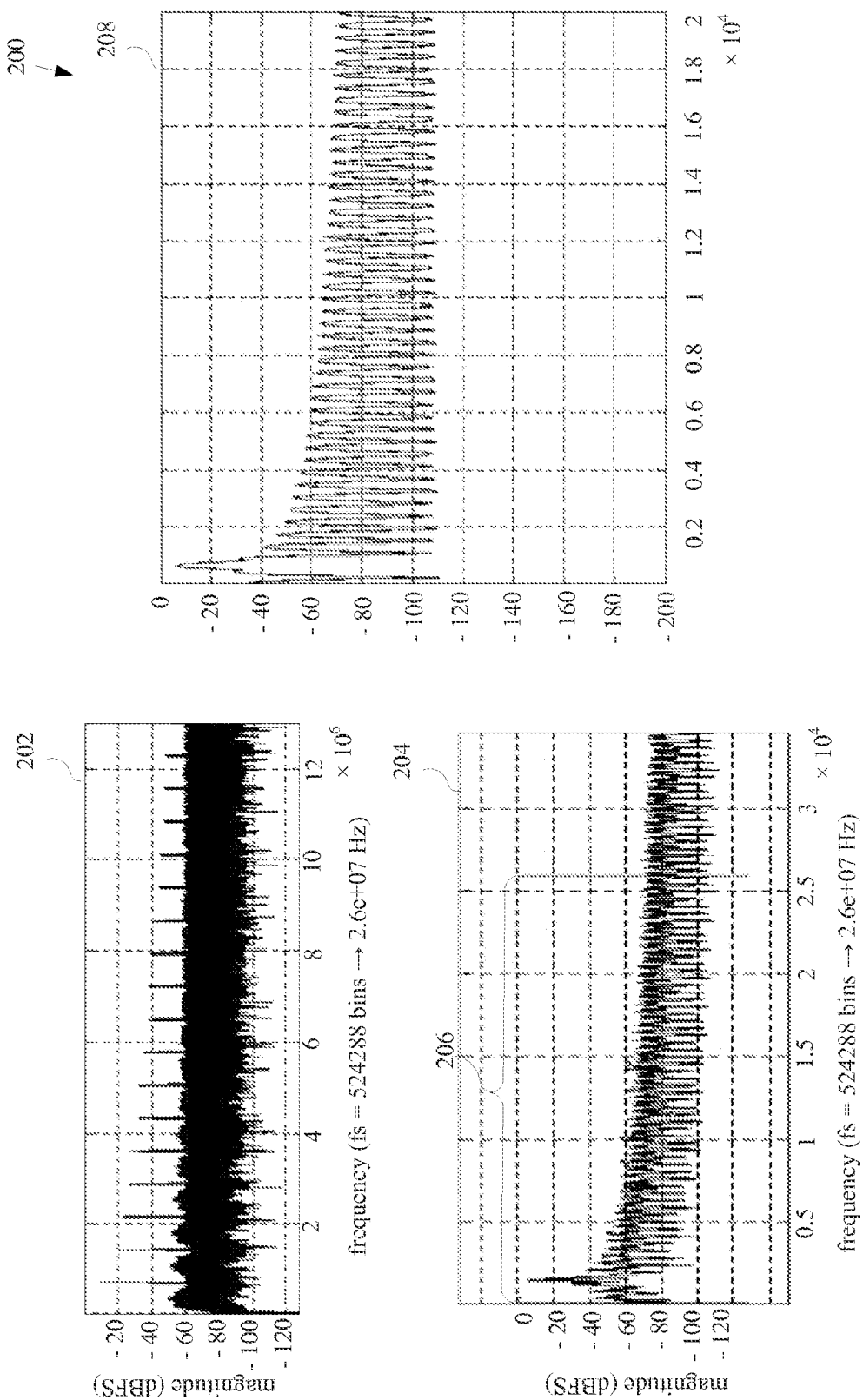
FIG. 2 illustrates simulation results of a conventional class-D amplifier without analog feedback.

FIG. 2 depicts several simulation results for a conventional digital class-D amplifier, such as digital class-D amplifier 100 of FIG. 1. The simulation results were obtained by modeling the traditional digital class-D amplifier using the graphical programming language tool Simulink™, developed by MathWorks, Inc. The simulation results are depicted in charts 202, 204 and 208 with the power supply noise at 217 Hz±10%. Charts 202, 204, and 208 correspond to the full output spectrum, the inband output spectrum, and the output spectrum without distortion, respectively. Chart 204 also depicts a signal bandwidth 206 of approximately 26 kHz. For the inband output spectrum depicted in chart 204, the signal-to-noise and distortion ratio (SNDR or SINAD) is around 20 dB, the oversampling ratio (OSR) is 500, and the total harmonic distortion (THD) is −41.9 dBc (decibels relative to the carrier).

A drawback to the design of digital class-D amplifier 100 is that feedback 132 is provided only from the output of comparator 116. There is no feedback for correcting errors generated by output stage 106. Moreover, digital class-D amplifier 100 suffers from limited power supply rejection (PSR) for high input signal levels where the supply disturbance is mixed with input signal 118 and creates modulation products around the fundamental frequency and its harmonics.

III. Digital Class-D Amplifier in Accordance with an Example Embodiment

Figure 3:
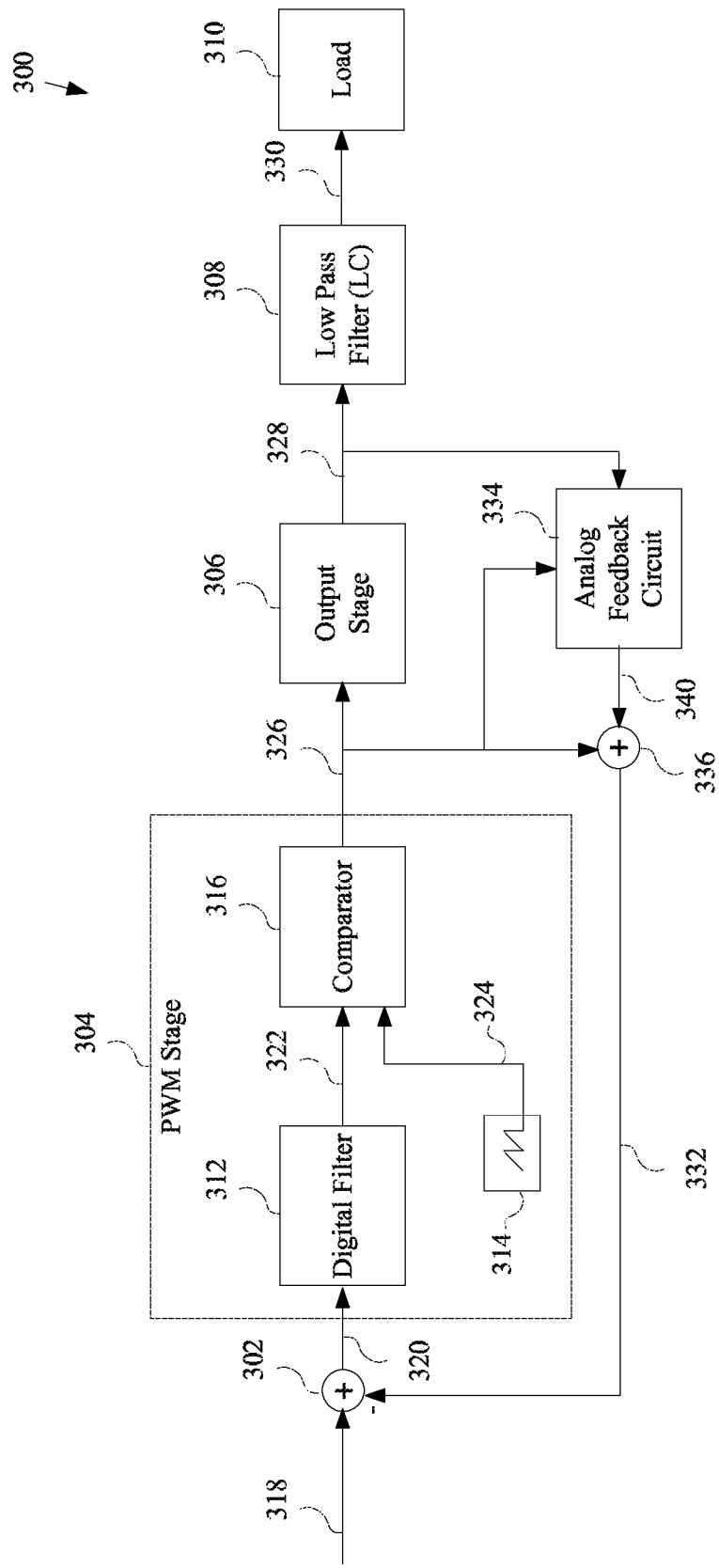
FIG. 3 is a block diagram of a digital class-D amplifier in accordance with an embodiment.

FIG. 3 is a block diagram of a digital class-D amplifier 300 in accordance with an example embodiment. Digital class-D amplifier 300 differs from digital class-D amplifier 100 of FIG. 1 in that digital class-D amplifier 300 includes an analog feedback to compensate for the analog error generated by the output stage. Digital class-D amplifier 300 may be implemented in any application to perform amplification of audio signals. For example, digital class-D amplifier 300 may be used in cellular telephones, home theater systems, powered speakers, or headphones.

As shown in FIG. 3, digital class-D amplifier 300 includes a number of interconnected elements including a combiner 302, a pulse-width modulation stage 302, an output stage 306, a low pass filter 308, a load 310, an analog feedback circuit 334, and a combiner 336. These elements are described in further detail as follows. Digital class-D amplifier 300 and its components may be implemented using digital signal processing technology and/or analog components and circuitry.

Combiner 302 is configured to receive input signal 318, which may be a digital representation of an audio signal. For example, input signal 318 may be a pulse-code modulated (PCM) signal that is a digital representation of an audio signal. Combiner 302 is further configured to combine input signal 318 with a feedback signal 332 to generate a combined signal 320. Combined signal 320 includes signal information from input signal 318 as well as error information from feedback signal 332. In accordance with certain embodiments, combiner 302 comprises a subtractor that is configured to subtract feedback signal 332 from input signal 318 to generate combined signal 320. Combiner 302 may be implemented with logic gates using diodes or transistors or compound logic gates, for example, an AND-OR-Invert (AOI) logic gate and an OR-AND-Invert (OAI) logic gate.

Pulse-width modulation stage 304 is configured to receive combined signal 320 and to generate a digital PWM signal 326 based thereon, as well as to provide PWM signal 326 as a first component of digital feedback signal 332. As shown in FIG. 3, pulse-width modulation stage 304 may include a digital filter 312, a triangle wave generator 314, and a comparator 316. Pulse-width modulation stage 304 may also be referred to herein as a digital loop or a control loop, which includes digital filter 312, triangle wave generator 318, comparator 316 and a digital feedback that includes PWM signal 326. Pulse-width modulation stage 304 and its components may be implemented using digital signal processing techniques (i.e., complementary metal-oxide-semiconductor (CMOS) technology) with a microprocessor, such as a digital signal processor or the like and/or analog circuitry using commercial off-the-shelf components and/or proprietary components. Although embodiments are described that include a pulse-width modulation stage, other modulation techniques may be used, for example, pulse-density modulation.

Digital filter 312 has a low pass filtering function in the frequency domain for spectral shaping, and is configured to integrate combined signal 320 to generate a filtered signal 322. Digital filter 312 may be implemented using a digital signal processor or as an integrator, with a cascade-of-integrators with feedforward topology (CIFF), or with a cascade-of-integrators with feedback (CIFB) topology, which may provide the advantage of hardware efficiency. For example, with the CIFF topology, feedforward signals from the input may be 14, 16, or 22-bit, while for the CIFB topology, multiple feedback signals from the output of pulse-width modulation stage 304 are 1-bit.

Comparator 316 is configured to compare filtered signal 322 with a triangle waveform 324 generated by triangle wave generator 114 at a fixed frequency, $f_{osc}$. The output of comparator 316 is a digital PWM signal 326, which toggles at the rate of $f_{osc}$. PWM signal 326 contains the frequency content of both combined signal 320 and triangle waveform 324. PWM signal 326 is fed back to the forward path as a digital feedback signal or a component thereof. Comparator 316 may be implemented as a digital signal processor, or as a differential amplifier or an operational amplifier that may be realized using complementary metal-oxide-semiconductor (CMOS) technology, for example.

Output stage 306 is configured to receive PWM signal 326 and to generate an analog output signal 328 for driving load 310 responsive to PWM signal 326. Output stage 306 produces an analog, amplified phase-reversed PWM pulse train as output signal 328. Output stage 306 may be implemented using power transistors, such as MOSFETs. In example embodiments, output stage 306 includes an open-loop driver.

Output stage 306 may be implemented as a half-bridge stage or a full H-bridge stage, formed with two half-bridges, to drive load 310 differentially. The H-bridge load connection may also be referred to as a bridge-tied load (BTL). Each half-bridge contains two output power transistors with a high-side transistor connected to the positive power supply and a low-side transistor connected to the negative supply. However, a single supply ($V_{dd}$) may be used to run the H-bridge circuit, with ground used for the negative supply terminal ($V_{ss}$). The differential nature of the H-bridge circuit enables twice the output signal swing when compared to a half-bridge amplifier with the same supply voltage. This results in a theoretical four times the output power over a half-bridge circuit operating from the same supply.

Low pass filter 308 is configured to receive output 328 and to recover input signal 318 by rejecting the high-frequency noise component and passing the low frequency component of output signal 328. Audio frequencies are typically in the lower frequency bands, around the 20 Hz-20 KHz range. Thus, low pass filter 308 may prevent high-frequency energy from being dissipated in load 310. Low pass filter 308 may be implemented with an inductor (L) and a capacitor (C) or a pair of each if a full H-bridge topology is used for output stage 306. The analog output of low pass filter 308 is output signal 330, which is passed to load 310. Load 310 may be one or more speakers or any other sound-producing devices.

Analog feedback circuit 334 is configured to receive PWM signal 326, which is a digital signal, and output signal 328, which is an analog signal, and to generate digital signal 340. Digital signal 340 represents only the noise introduced by output stage 306. In certain embodiments, digital signal 340 represents a 1-bit feedback. Analog feedback circuit 334 will be described in further detail below in reference to FIGS. 5 and 6.

Combiner 336 is configured to receive PWM signal 326 and digital signal 340 and to generate combined signal 332 based thereon. Combined signal 332 represents the total system feedback that compensates for the digital error (e.g., noise, distortion) introduced by pulse-width modulation stage 304 and the analog error introduced by output stage 306. In this manner, digital class-D amplifier 300 can account for the analog error introduced by output stage 306 by using loop-gain to suppress the analog error while keeping intact the digital feedback that is represented by PWM signal 326, which dominates pulse-width modulation stage 304. In accordance with certain embodiments, combiner 336 comprises an adder that is configured to add PWM signal 326 and digital signal 340 to generate combined signal 332. Combiner 336 may be implemented with logic gates using diodes or transistors or compound logic gates, for example, an AND-OR-Invert (AOI) logic gate and an OR-AND-Invert (OAI) logic gate.

Figure 4:
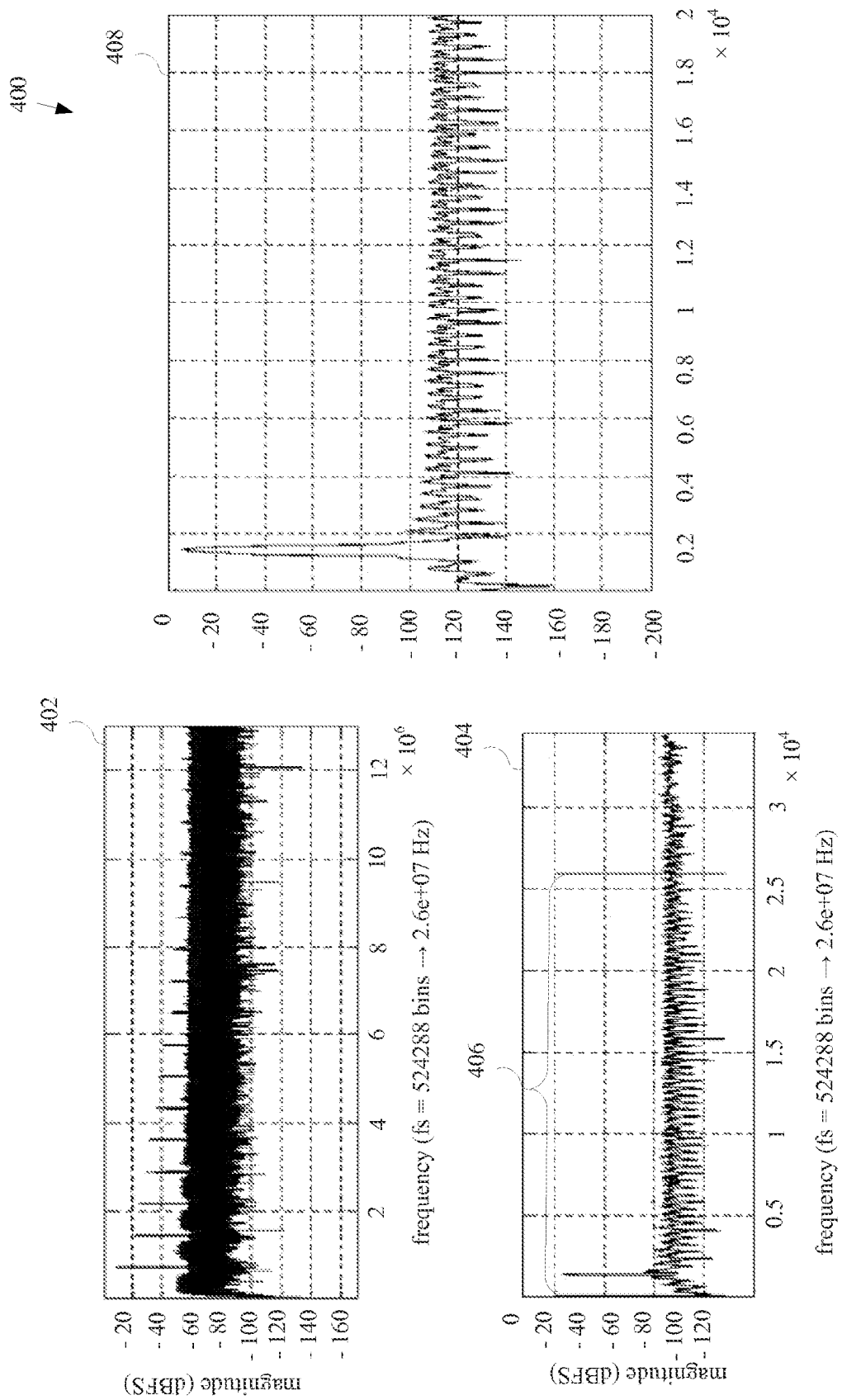
FIG. 4 illustrates simulation results of a digital class-D amplifier with analog feedback in accordance with an embodiment.

FIG. 4 depicts several simulation results for a digital class-D amplifier with analog feedback, such as class-D amplifier 300 of FIG. 3. The simulation results were obtained by modeling the class-D amplifier with analog feedback using the graphic programming language tool Simulink™, developed by MathWorks, Inc. The simulation results are depicted in charts 402, 404 and 408 with the power supply ($V_{dd}$) noise at 217 Hz±10%. Charts 402, 404, and 408 correspond to the full output spectrum, the inband output spectrum, and the output spectrum without distortion, respectively. Chart 404 also depicts a signal bandwidth 406 of approximately 26 kHz. For the inband output spectrum depicted in chart 404, the signal-to-noise and distortion ration (SNDR or SINAD) is around 80 dB, the over-sampling ration (OSR) is 500, and the total harmonic distortion (THD) is −94.2 dBc (decibels relative to the carrier).

Figure 5:
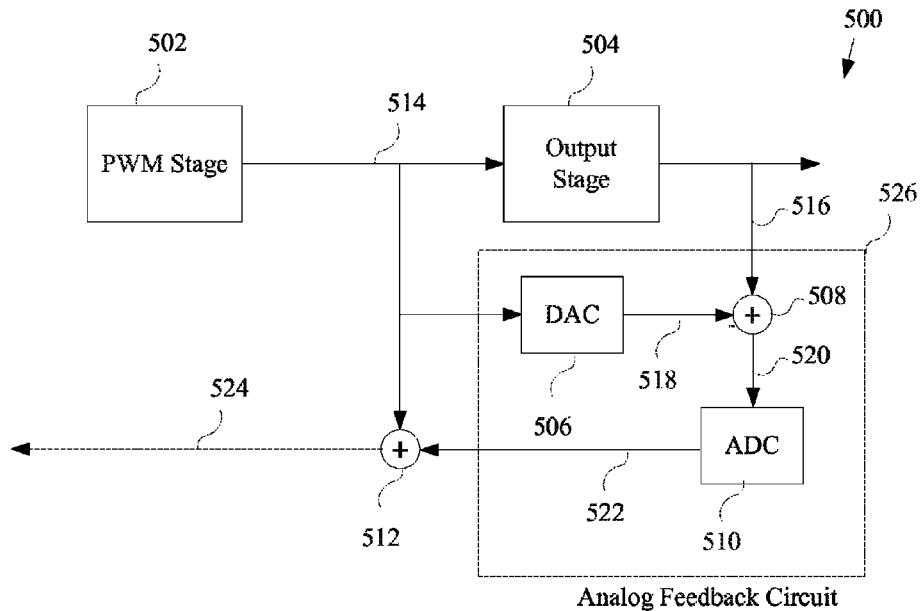
FIGS. 5-6 illustrates components of an analog feedback circuit of a digital class-D amplifier in accordance with various embodiments.

FIG. 5 is a block diagram of a portion of a digital class-D amplifier 500 in accordance with an example embodiment. Digital class-D amplifier 500 is similar to digital class-D amplifier 300 of FIG. 3 but with the analog feedback being depicted in more detail. Thus, for the sake of brevity, components that are similar to components already described in FIG. 3 will be briefly described or not described or not depicted. Digital class-D amplifier 500 may be implemented using digital signal processing technology and/or analog components and circuitry.

Digital class-D amplifier 500 includes a pulse-width modulation stage 502, an output stage 504, a combiner 512, and an analog feedback circuit 526, which are similar to pulse-width modulation stage 304, output stage 306, combiner 336, and analog feedback circuit 334, respectively, as depicted in FIG. 3. As shown in FIG. 5, analog feedback circuit 526 includes a digital-to-analog converter (DAC) 506, a combiner 508, and an analog-to-digital converter (ADC) 510. Analog feedback circuit 526 is configured to detect and suppress the analog error generated by output stage 504.

In accordance with certain embodiments, DAC 506 is configured to receive a digital PWM signal 514 from pulse-width modulation stage 502 and to convert digital PWM signal 514 to an analog PWM signal 518, which represents the PWM signal 514 in an analog form. Combiner 508 is configured to combine analog PWM signal 518 with an analog output signal 516 received from output stage 504 to generate a combined signal 520. In an embodiment, combiner 508 comprises a subtractor and analog PWM signal 518 is subtracted from analog output signal 516. Combined signal 520 represents the analog error, in analog form, generated by output stage 504 because the input signal component has been removed by the subtraction performed by the subtractor. ADC 510 is configured to convert combined signal 520 to a digital form to generate a digital feedback signal 522.

Combiner 512 is configured to combine PWM signal 514 and digital feedback signal 522 to generate a digital feedback signal 524. Digital feedback signal 524 is combined with the digital input signal in the forward path. Digital feedback signal 524 represents the total system feedback that compensates for the digital error introduced by pulse-width modulation stage 502 and the analog error generated by output stage 504. Combiner 512 may be implemented with logic gates using diodes or transistors or compound logic gates, for example, an AOI logic gate and an OAI logic gate.

Figure 6:
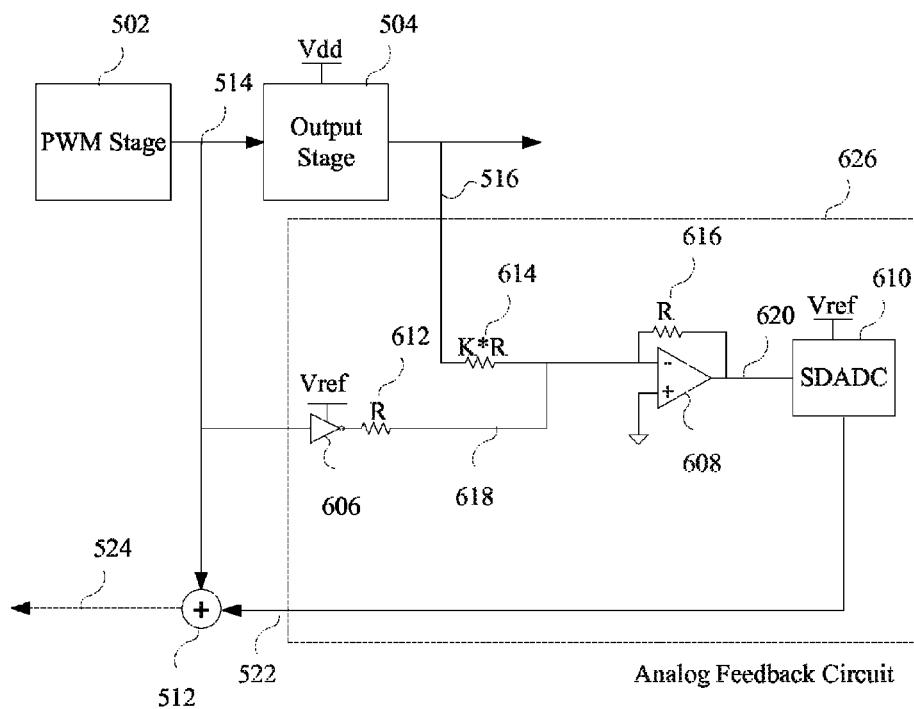

Analog feedback circuit 526 may be implemented with digital processing technology and/or analog processing technology. For example, in accordance with certain embodiments, DAC 506 and ADC 510 may be implemented using digital processing technology while combiner 508 may be implemented using analog processing technology. FIG. 6 is a block diagram that depicts an implementation of analog feedback circuit 526 as an analog feedback circuit 626 in accordance with certain embodiments.

As shown in FIG. 6, DAC 506 from FIG. 5 may be implemented as a level shifter or an inverter 606. Inverter 606 is configured to invert PWM signal 514 such that a subtraction function may be implemented with analog output signal 516.

Combiner 508 may be implemented as a circuit that includes a plurality of resistors and an operational-amplifier. More specifically and as shown in FIG. 6, combiner 508 comprises a resistor 612, a resistor 614, a resistor 616 and an operational-amplifier (op-amp) 608. Resistor 612 is coupled to an output of inverter 606 and an input of op-amp 608. Resistor 614 is coupled to an output of output stage 504 and the same input of op-amp 608 as resistor 612. Resistor 616 is coupled to an output of op-amp 608 and the same input of op-amp 608 as resistor 612. In accordance with an embodiment, resistor 612 and resistor 616 may have the same resistance value, R, while resistor 614 may have a resistance value of K×R, where $$K = \frac{V_{dd}}{V_{ref}}$$

These resistance values ensures that the gain of op-amp 608 is correctly set such that the gain of the digital feedback matches the gain of the analog feedback of the digital class-D amplifier of FIGS. 5 and 6.

ADC 510 may be implemented as any ADC known in the art. In certain embodiments, ADC 510 may be implemented as a sigma-delta ADC (SDADC) 610 as shown in FIG. 6. A sigma-delta ADC typically oversamples the desired signal and then filters the desired signal band. Generally, a smaller number of bits than required are converted using a flash ADC after the filter. The flash ADC includes a bank of comparators that sample the input signal in parallel, each comparator firing for their decoded voltage range. The comparator bank feeds a logic circuit that generates a code for each voltage range. The resulting signal, including any error generated by the discrete level of the flash ADC, is fed back and subtracted from the input to the filter. This negative feedback has a functionality of noise shaping error generated by the flash ADC such that the error will not appear in the desired signal frequencies. A decimation filter may be used after the SDADC to reduce the sampling rate, reject unwanted noise signal, and increase the resolution of the output. SDADC 610 is configured to generate a 1-bit error feedback, as digital feedback signal 512, which represents the analog error introduced by output stage 504 in digital form. In an example embodiment, the voltage references of inverter 606 and SDADC 610 are equal in value. This correlation of the voltage references along with setting the correct gain for op-amp 608 ensures that there is no mismatch between the gains of the digital feedback and the analog feedback of the digital class-D amplifier system.

The implementation of analog feedback circuit 626 shown in FIG. 6 provides several advantages including a more relaxed speed, accuracy, and input dynamic range requirement for the ADC. If the digital class-D amplifier is designed to have the analog feedback only, without the digital feedback, then the ADC (e.g., ADC 510 of FIG. 5) would have to transfer the rail-to-rail square wave (i.e., the class-D output) that contains both signal and noise information. This would require an ADC that is very fast, has low latency, and is extremely accurate to faithfully transfer the class-D output back to the forward path to be combined with the initial audio input signal. Otherwise, the signal information would be lost or delayed and the feedback loop may become unstable and not work properly. This is especially difficult for transferring the transition edge (i.e., the rise or the fall) of the square wave. In contrast, when the digital class-D amplifier is designed to have the digital feedback as the main feedback, the signal information can be fed back without error and latency in the digital domain. The presence of the digital feedback highly relaxes the burden on the ADC and stabilizes the class-D amplifier system. This is because the analog feedback has an effect on the noise attenuation efficiency, but no effect on the class-D amplifier system's functionality and stability. In addition, the input dynamic range requirement for the ADC is also relaxed because a signal containing only the analog error information is much smaller than a signal containing both the input signal information and the analog error information.

Another advantage of analog feedback circuit 626 is that it provides a good fit for a sigma-delta ADC as the feedback ADC. The sigma-delta ADC is highly accurate, has a simple architecture, and provides a single bit output such that only a 1 bit combiner is needed to add the analog error to the digital feedback. Moreover, while a decimation filter (also known as a digital filter) usually follows a sigma-delta ADC, in certain embodiments such decimation filter is not needed. This is because there is no quantization error folding back due to the zeros at $DC/F_{clk}$ in the noise transfer function (NTF) of the ADC as long as the ADC has a clock frequency that is the same as the clock frequency of the control loop of the class-D amplifier. The control loop represents the digital loop, which includes the digital filter, the comparator, the triangle wave generator, and the digital feedback. Thus, the raw output of the ADC may be fed directly into the digital loop, resulting in a reduction in the latency of the ADC as well as a reduction in circuitry complexity.

Figure 7:
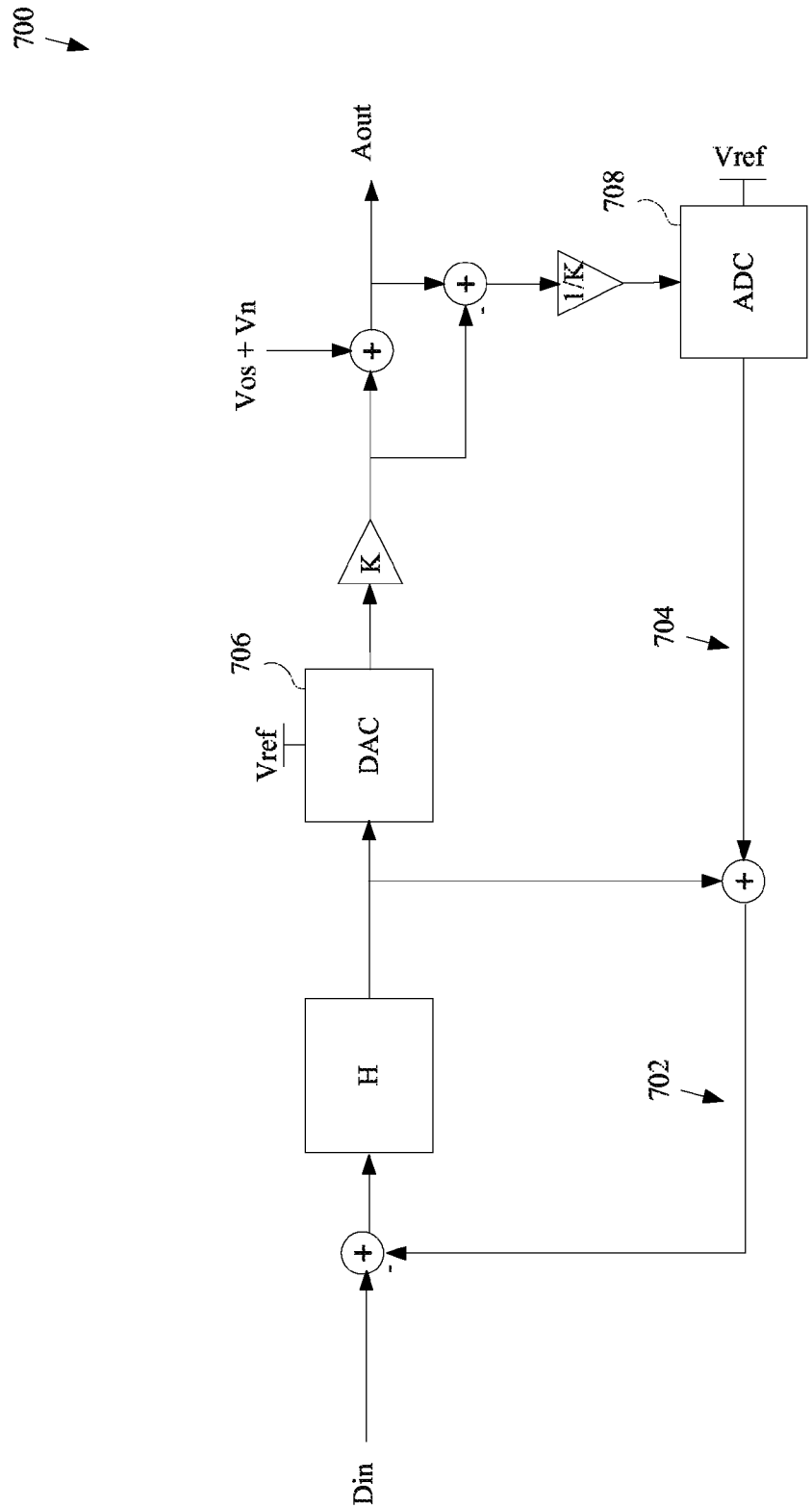
FIG. 7 is a block diagram of a digital class-D amplifier that is insensitive to the accuracy of a reference voltage in accordance with an embodiment.

Analog feedback circuit 626 provides another advantage, which is the insensitivity of the feedback system to the accuracy of the voltage reference. This advantage will be described in reference to FIG. 7. FIG. 7 is a block diagram of a digital-class D amplifier 700 with analog feedback in accordance with certain embodiments. Digital-class D amplifier 700 has a normalized output of K×Vref Referring to FIG. 7, a gain of a digital feedback signal 702 is equal to a gain of an analog feedback loop 704 independent of the reference voltage accuracy because DAC 706 and ADC 708 use the same reference voltage. Thus, the gains of DAC 706 and ADC 708 are cancelled while the gain of the op-amp, an example of which is op-amp 608 shown in FIG. 6, on the DAC 706 path and the ADC 708 path is also cancelled. $V_{os}$ and $V_n$ are parameters of such an op-amp. $V_n$ represents the input noise voltage and $V_{os}$ represents the input offset voltage, which is a direct-current (DC) voltage that must be applied between the input terminals of the op-amp to cancel DC offsets within the op-amp. Both $V_{os}$ and $V_n$ are attenuated by the analog loop-gain, where the $V_n$ attenuation may be referred to as "PSR" (power supply rejection) and the $V_{os}$ attenuation may be referred to as "line-regulation," which is the capability to maintain a constant output voltage level on the output channel of a power supply despite input voltage level changes. By setting the DAC and ADC reference voltages to the same value, and setting the correct gain coefficients in the op-amp, PSR and line regulation may both be improved without concerns relating to the reference voltage accuracy.

In general, the digital class-D amplifier with analog feedback as described herein in accordance with certain embodiments provide advantages relating to the circuitry, the system, as well as the product. With respect to the circuitry, the digital class-D amplifier with analog feedback improves power supply rejection and enables the output stage gain to be insensitive to the power supply value. Because of the improvement to the circuitry, it is possible to connect the output stage directly to the battery instead of a low-dropout (LDO) regulator.

Moreover, because the digital class-D amplification system is highly digital, digital process scaling may be taken advantage of to reduce system area and power. With conventional class-D amplifiers, it is difficult to separate the output stage from the feedback loop because of the multitude of analog signals between the two. With the disclosed digital class-D amplifier configurations, the feedback loop around the output stage may be placed far away from the output stage because the signal that is passed between the output stage and the feedback loop is digital. As a product, the digital class-D amplifier with analog feedback may be implemented in platforms with power supply rejection ratio requirements that are not suitable for traditional class-D amplifiers.

Figure 8:
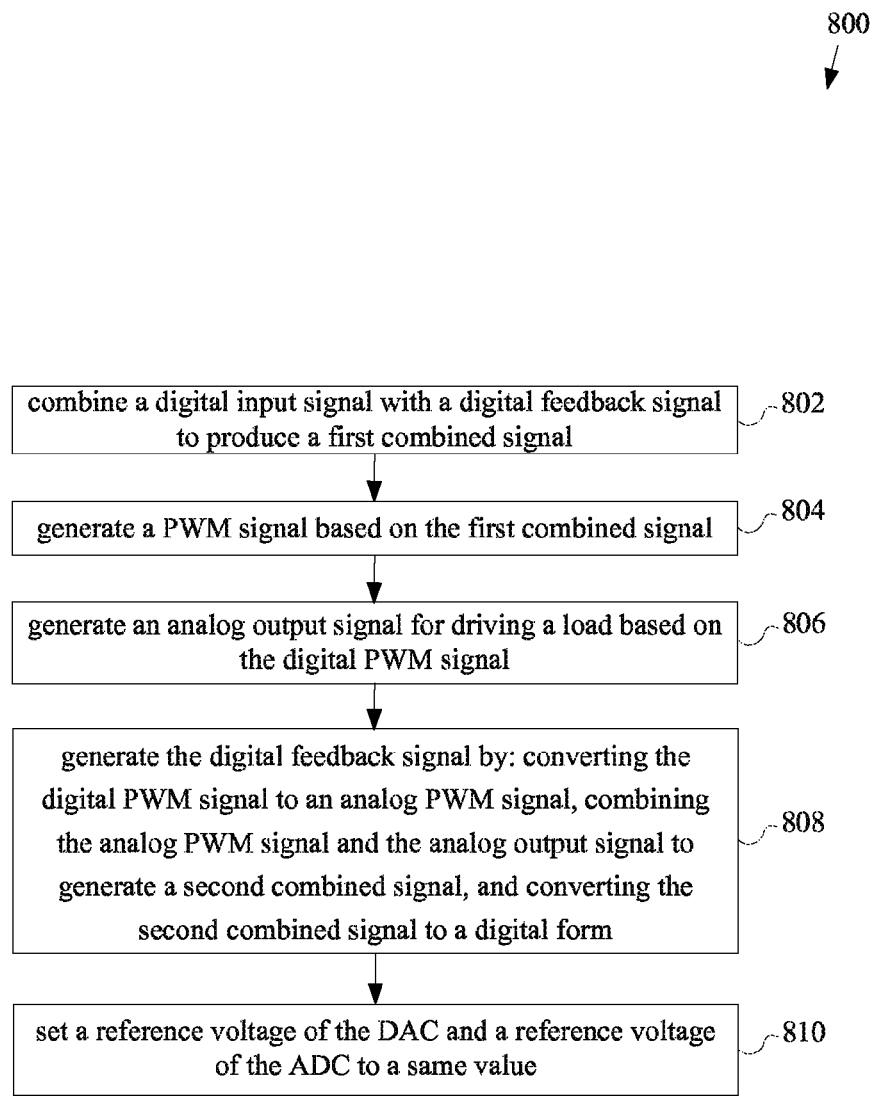
FIG. 8 depicts a flowchart of a method for detecting and suppressing analog error associated with the output stage of a digital class-D amplifier in accordance with an embodiment.

FIG. 8 depicts a flowchart 800 for detecting and suppressing analog error associated with an output stage of a class-D amplifier in accordance with an embodiment. The method of flowchart 800 is presented by way of example only and is not intended to be limiting. The steps of flowchart 800 may be performed using a digital class-D amplifier, such as digital class-D amplifier 300 shown in FIG. 3 or digital class-D amplifier 500 shown in FIGS. 5 and 6. Therefore, flowchart 800 will be described with references to these amplifiers and/or their components. However, the method of flowchart 800 is not limited to those embodiments. Further structural and operational embodiments will be apparent to persons skilled in the relevant art(s) based on the discussion regarding flowchart 800. Flow chart 800 is described as follows.

Flowchart 800 begins with step 802. In step 802, a digital input signal is combined with a digital feedback signal to produce a first combined signal. For example, in an embodiment, digital input signal 318 is combined with digital feedback signal 332 to produce combined signal 320. Combined signal 320 includes signal information from input signal 318 as well as error information from feedback signal 332.

In an embodiment, step 802 comprises subtracting the digital feedback signal from the digital input signal. For example, as shown in FIG. 3, digital feedback signal 332 may be subtracted from digital input signal 318 to generate combined signal 320.

In step 804, a PWM signal is generated based on the first combined signal. For example, as shown in FIG. 3, PWM signal 326 is generated based on combined signal 320. PWM signal 326 contains the frequency content of both combined signal 320 and triangle waveform 324.

In step 806, an analog output signal is generated for driving a load based on the digital PWM signal. For example, as shown in FIG. 3, analog output signal 328 is generated for driving load 310 based on PWM signal 326.

In step 808, the digital feedback signal is generated by converting the digital PWM signal to an analog PWM signal, combining the analog PWM signal and the analog output signal to generate a second combined signal, and converting the second combined signal to a digital form. For example, as shown in FIG. 5, digital feedback signal 524 is generated by converting digital PWM signal 514 to analog PWM signal 518, combining analog PWM signal 518 and analog output signal 516 to generate combined signal 520, and converting combined signal 520 to a digital form.

In step 810, a reference voltage of the DAC and a reference voltage of the ADC is set to a same value. For example, as shown in FIG. 6, the reference voltage of the DAC, implemented as inverter 606, and the reference voltage of SDADC 610 are set to the same value. Setting the reference voltages to the same value in addition to setting the gain of op-amp 608 to the correct value (by setting the resistor values as described above in reference to FIG. 6) ensures that there is no gain mismatch between the digital feedback and the analog feedback.

Figure 9:
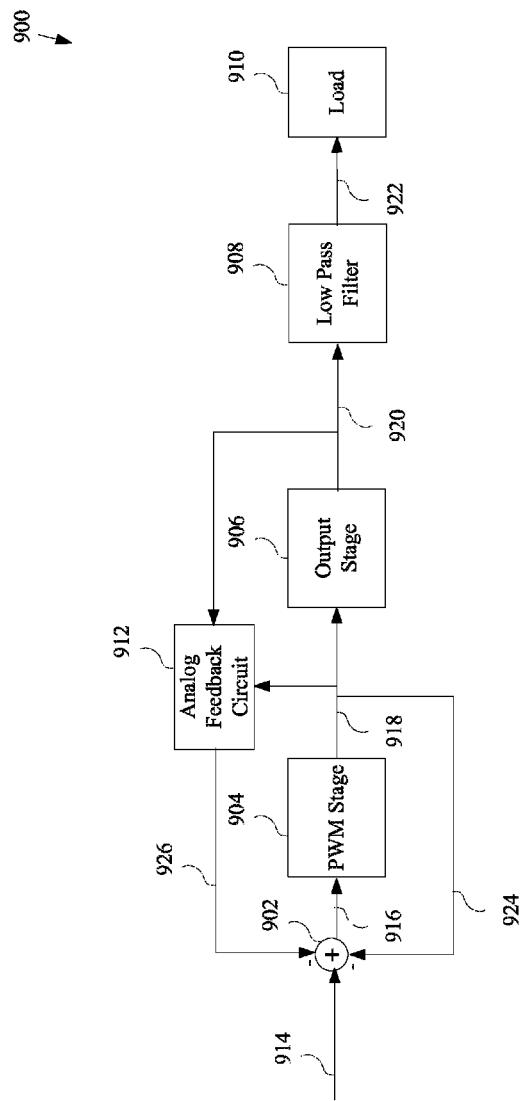
FIG. 9 is a block diagram of another implementation of a digital class-D amplifier in accordance with an embodiment.

IV. Digital Class-D Amplifier with Analog Feedback in Accordance with Another Example Embodiment FIG. 9 is a block diagram of a digital class-D amplifier 900 in accordance with an example embodiment. Digital class-D amplifier 900 is similar to digital class-D amplifier 300 of FIG. 3, with the difference being the digital feedback from the digital loop and the digital feedback from the output stage are individually fed back to the forward path at the combiner for digital class-D amplifier 900. Digital class-D amplifier 900 includes a number of interconnected elements including a combiner 902, a pulse-width modulation stage 904, an output stage 906, a low pass filter 908, a load 910, and an analog feedback circuit 912. These elements are described in further detail as follows. Digital class-D amplifier 900 and its components may be implemented using digital signal processing technology and/or analog components and circuitry.

Combiner 902 is configured to receive input signal 914, which may be a digital representation of an audio signal. For example, input signal 914 may be a PCM signal that is a digital representation of an audio signal. Combiner 902 is further configured to combine input signal 914 with a first feedback signal 924 and a second feedback signal 926 to generate a combined signal 916. First feedback signal 924 is a digital signal from the output of pulse-width modulation stage 904 and represents the digital error introduced by pulse-width modulation stage 904. Second feedback signal 926 is a digital signal from the output of analog feedback circuit 912 and represents the analog error introduced by output stage 906. Combined signal 916 includes signal information from input signal 914 as well as error information from both first feedback signal 924 and second feedback signal 926. In accordance with certain embodiments, combiner 914 comprises a subtractor that is configured to subtract first feedback signal 924 and second feedback signal 926 from input signal 914 to generate combined signal 916. Combiner 902 may be implemented digital processing technology, such as logic gates using diodes or transistors or compound logic gates, for example, an AND-OR-Invert (AOI) logic gate and an OR-AND-Invert (OAI) logic gate.

Pulse-width modulation stage 904 is configured to receive combined signal 916 and to generate a digital PWM signal 918 based thereon, as well as to provide PWM signal 918 as first feedback signal 924. Although not shown, pulse-width modulation stage 904 may include a digital filter, a triangle wave generator, and a comparator for generating PWM signal 918. Pulse-width modulation stage 904 may herein be referred to as a digital loop or a control loop, which includes the digital filter, triangle wave generator, comparator and a digital feedback that includes PWM signal 918. Pulse-width modulation stage 904 and its components may be implemented using digital signal processing techniques (i.e., complementary metal-oxide-semiconductor (CMOS) technology) with a microprocessor, such as a digital signal processor or the like and/or analog circuitry using commercial off-the-shelf components and/or proprietary components. Although embodiments are described with a pulse-width modulation stage, other modulation techniques may be used, for example, pulse-density modulation.

Output stage 906 is configured to receive PWM signal 918 and to generate an analog output signal 920 for driving load 910 responsive to PWM signal 918. Output stage 906 produces an analog, amplified phase-reversed PWM pulse train as output 920. Output stage 906 may be implemented using power transistors, such as MOSFETs. In an example embodiment, output stage 906 includes an open-loop driver. In another example embodiment, output stage 906 includes a closed-loop driver.

Output stage 906 may be implemented as a half-bridge stage or a full H-bridge stage, formed with two half-bridges, to drive load 900 differentially. The H-bridge load connection may also be referred to as a bridge-tied load (BTL). Each half-bridge contains two output power transistors with a high-side transistor connected to the positive power supply and a low-side transistor connected to the negative supply. However, a single supply ($V_{dd}$) may be used to run the H-bridge circuit, with ground used for the negative supply terminal ($V_{ss}$). The differential nature of the H-bridge circuit enables twice the output signal swing when compared to a half-bridge amplifier with the same supply voltage. This results in a theoretical four times the output power over a half-bridge circuit operating from the same supply.

Low pass filter 908 is configured to receive output signal 920 and to recover the input signal 914 by rejecting the high-frequency noise component and passing the low frequency component of output signal 920. Low pass filter 908 may be implemented with an inductor (L) and a capacitor (C) or a pair of each if a full H-bridge topology is used for output stage 906. The analog output of low pass filter 908 is output signal 922, which is passed to load 910. Load 910 may be one or more speakers or any other sound-producing device.

Analog feedback circuit 912 is configured to receive PWM signal 918, which is a digital signal, and output signal 920, which is an analog signal, and to generate second feedback signal 926. Second feedback signal 926 represents only the noise introduced by output stage 906. In certain embodiments, digital signal 926 represents a 1-bit feedback. Analog feedback circuit 912 may be implemented in a like manner to analog feedback circuit 526 of FIG. 5 and/or analog feedback circuit 626 of FIG. 6.

Figure 11:
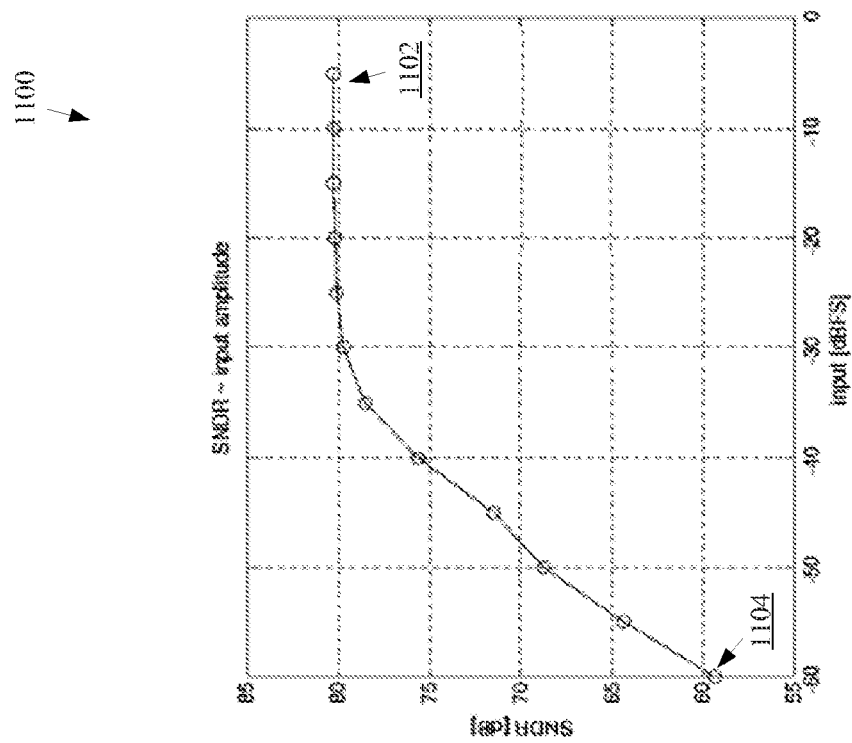
FIG. 11 depicts simulation results relating to an input signal of a digital class-D amplifier in accordance with an embodiment.
Figure 10:
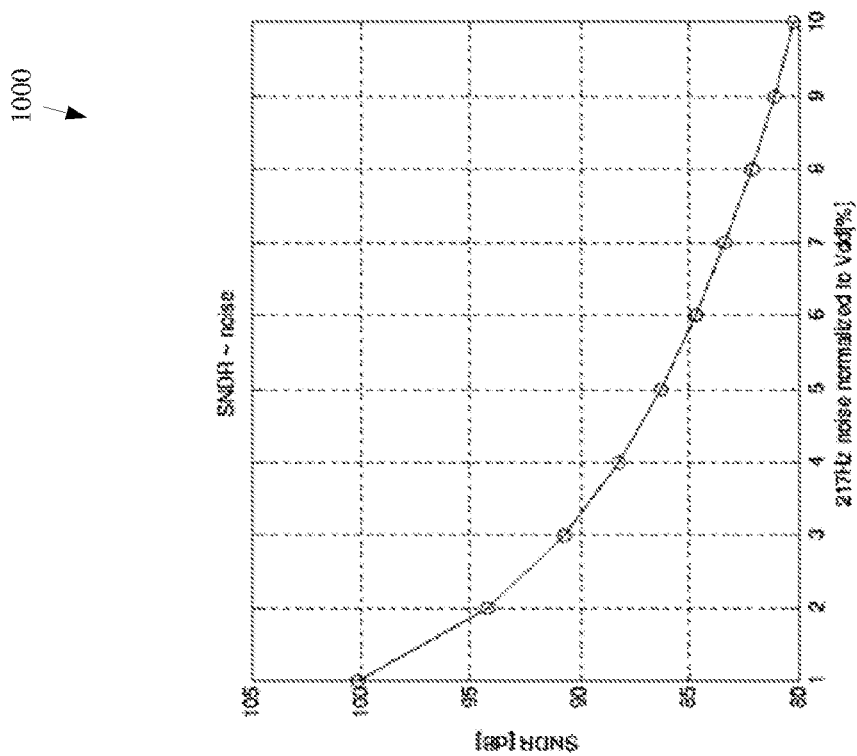
FIG. 10 depicts simulation results relating to supply noise of a digital class-D amplifier in accordance with an embodiment.
Figures 12, 13:
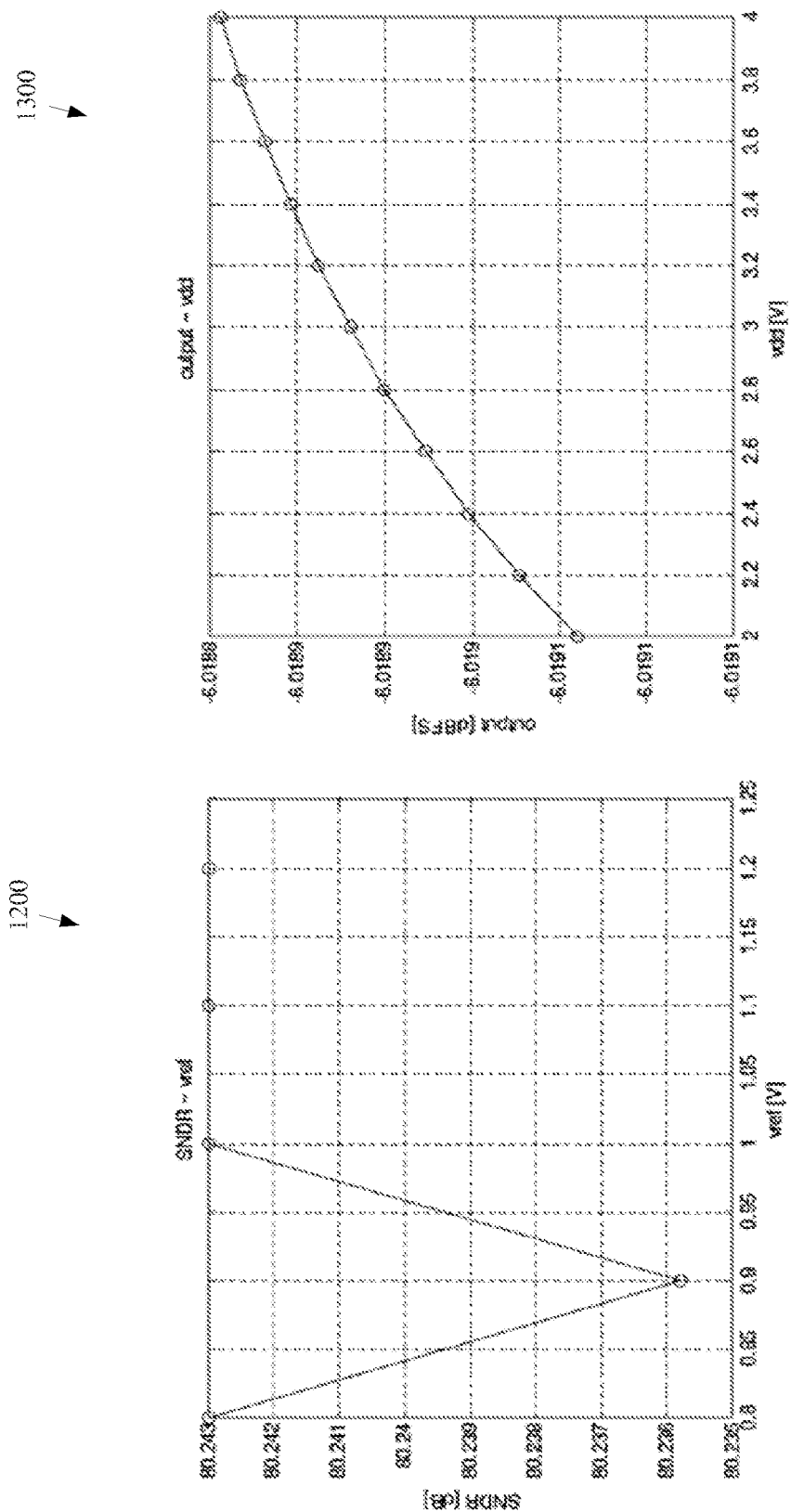
FIG. 12 depicts simulation results relating to a reference voltage of a digital class-D amplifier in accordance with an embodiment.
FIG. 13 depicts simulation results relating to a power supply voltage of a digital class-D amplifier in accordance with an embodiment.

V. Simulation Results for a Digital Class-D Amplifier in Accordance with an Example Embodiment FIGS. 10-13 depict simulation results for a number of parameters of a digital class-D amplifier in accordance with an example embodiment. The simulation results are obtained from modeling the digital class-D amplifier with analog feedback using the graphical programming language tool Simulink™, developed by MathWorks, Inc. FIG. 10 illustrates plot 1000 depicting a sweep of the supply noise amplitude where $V_{out}$=−6 dBFS (decibels relative to full scale). FIG. 11 illustrates plot 1100 depicting a sweep of the input signal amplitude where the supply noise=±10% $V_{dd}$ at 217 Hz. As shown in plot 1100, the dynamic range 1104 of the digital-class D amplifier is determined to be 119 dB and the peak SNDR (signal-to-noise and distortion ratio) 1102 is 80 dB, which is limited by the supply noise induced tones. FIG. 12 illustrates plot 1200 depicting a sweep of the voltage reference, $V_{ref}$ (±20%), where the $V_{in}$=−6 dBFS and the supply noise=±10% $V_{dd}$ at 217 Hz. As shown in FIG. 12, the SNDR remains constant because it is insensitive to the accuracy of the reference voltage. FIG. 13 illustrates plot 1300 depicting a sweep of the supply voltage, $V_{dd}$ (±30%), where the $V_{in}$=−6 dBFS and the supply noise=±10% $V_{dd}$ at 217 Hz. As shown in FIG. 13, the relative output remains constant with unit of dBFS, referred to as K×Vref, and the absolute output remains constant because the absolute output is proportional to K×Vref.

VI. Hardware and Software Implementation

Figure 14:
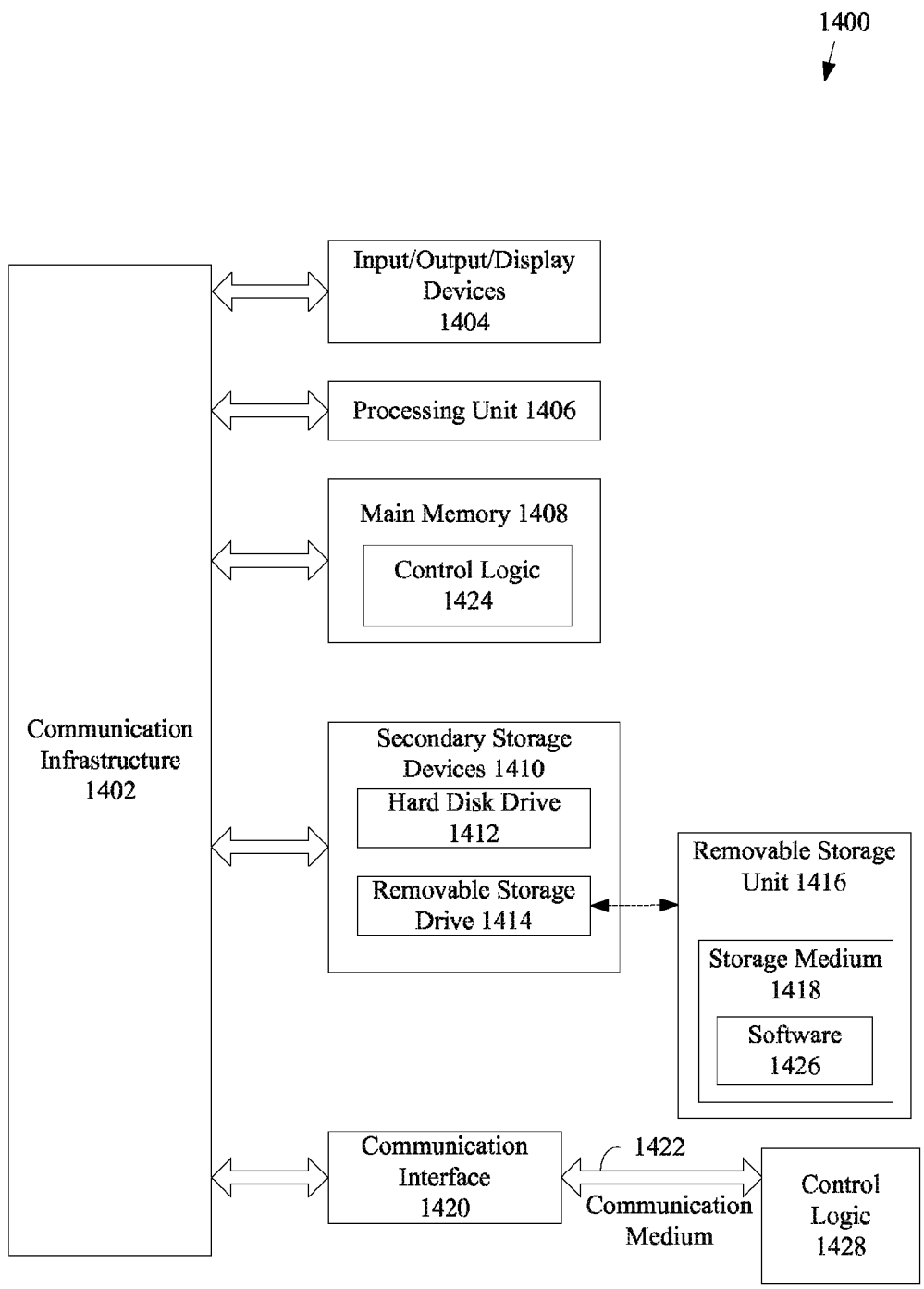
FIG. 14 is a block diagram of an example computing system that may be used to implement various embodiments in whole or in part.

The embodiments described herein, including systems, methods/processes, and/or apparatuses, may be implemented using well known computing devices, such as computer 1400 shown in FIG. 14. For example, elements of digital class-D amplifier 300 and digital class-D amplifier 500, including pulse-width modulation stage 304, digital filter 312, triangle wave generator 314, comparator 316, depicted in FIG. 3; pulse-width modulation stage 502, analog feedback circuit 526, depicted in FIG. 5; inverter 606 and SDADC 610 depicted in FIG. 6; PWM stage 904 and analog feedback circuit 912, depicted in FIG. 9; and one or more steps of flowchart 800 depicted in FIG. 8 can each be implemented using one or more computers 1400.

As shown in FIG. 14, computer 1400 includes a processing unit 1406. Processing unit 1406 may comprise one or more processors (also called central processing units or CPUs) or processor cores. Processing unit 1406 is connected to a communication infrastructure 1402, such as a communication bus. Computer 1400 also includes a primary or main memory 1408, such as random access memory (RAM). Main memory 1408 has stored therein control logic 1424 (computer software), and data.

Computer 1400 also includes one or more secondary storage devices 1410. Secondary storage devices 1410 include, for example, a hard disk drive 1412 and/or a removable storage device or drive 1414, as well as other types of storage devices, such as memory cards and memory sticks. For instance, computer 1400 may include an industry standard interface, such as a universal serial bus (USB) interface for interfacing with devices such as a memory stick. Removable storage drive 1414 represents a floppy disk drive, a magnetic tape drive, a compact disk drive, an optical storage device, tape backup, etc.

Removable storage drive 1414 interacts with a removable storage unit 1416. Removable storage unit 1416 includes a computer useable or readable storage medium 1418 having stored therein computer software 1426 (control logic) and/or data. Removable storage unit 1216 represents a floppy disk, magnetic tape, compact disc (CD), digital versatile disc (DVD), Blu-ray disc, optical storage disk, memory stick, memory card, or any other computer data storage device. Removable storage drive 1414 reads from and/or writes to removable storage unit 1416 in a well-known manner.

Computer 1400 also includes input/output/display devices 1404, such as monitors, keyboards, pointing devices, etc.

Computer 1400 further includes a communication or network interface 1420. Communication interface 1420 enables computer 1400 to communicate with remote devices. For example, communication interface 1420 allows computer 1400 to communicate over communication networks or mediums 1422 (representing a form of a computer useable or readable medium), such as local area networks (LANs), wide area networks (WANs), the Internet, etc. Network interface 1420 may interface with remote sites or networks via wired or wireless connections. Examples of communication interface 1422 include but are not limited to a modem (e.g., for 3G and/or 4G communication(s)), a network interface card (e.g., an Ethernet card for Wi-Fi and/or other protocols), a communication port, a Personal Computer Memory Card International Association (PCMCIA) card, a wired or wireless USB port, etc.

Control logic 1428 may be transmitted to and from computer 1400 via the communication medium 1422.

Any apparatus or manufacture comprising a computer useable or readable medium having control logic (software) stored therein is referred to herein as a computer program product or program storage device. This includes, but is not limited to, computer 1400, main memory 1408, secondary storage devices 1410, and removable storage unit 1416. Such computer program products, having control logic stored therein, may be executed by processing unit 1406 to perform methods described herein. For example, such computer program products, when executed by processing unit 1406, may cause processing unit 1406 to perform any of the steps of flowchart 800 of FIG. 8.

The disclosed technologies may be embodied in software, hardware, and/or firmware implementations other than those described herein. Any software, hardware, and firmware implementations suitable for performing the functions described herein can be used.

VII. Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A class-D amplifier, comprising:
a first combiner operable to combine a digital input signal and a digital feedback signal to generate a first combined signal;
a digital loop operable to receive the first combined signal and to generate a digital pulse-width modulated (PWM) signal based thereon and to provide the digital PWM signal as a first component of the digital feedback signal and as an input to a feedback circuit;
an output stage operable to receive the digital PWM signal and to generate an analog output signal for driving a load responsive to the digital PWM signal; and
the feedback circuit comprising
a digital to analog converter (DAC) operable to convert the digital PWM signal to an analog PWM signal,
a second combiner operable to combine the analog PWM signal and the analog output signal to generate a second combined signal, and
an analog to digital converter (ADC) operable to convert the second combined signal to a digital form to generate a second component of the digital feedback signal.

2. The class-D amplifier of claim 1, wherein the first combiner comprises: a subtractor operable to subtract the digital feedback signal from the digital input signal.

3. The class-D amplifier of claim 1, wherein the DAC comprises an inverter.

4. The class-D amplifier of claim 1, wherein the second combiner comprises a first resistor, a second resistor, a third resistor, and an operational amplifier,
the first resistor having a first terminal coupled to an output of the output stage and a second terminal coupled to an input of the operational amplifier,
the second resistor having a first terminal coupled to the output of the DAC and a second terminal coupled to the input of the operational amplifier,
the third resistor having a first terminal coupled to an output of the operational amplifier and a second terminal coupled to the input of the operational amplifier.

5. The class-D amplifier of claim 1, wherein a reference voltage of the DAC and a reference voltage of the ADC are equal.

6. The class-D amplifier of claim 1, wherein the ADC is a sigma-delta ADC.

7. The class-D amplifier of claim 1, wherein the output stage comprises an open loop driver.

8. The class-D amplifier of claim 1, further comprising:
a low pass filter coupled to an output of the output stage; and
wherein the load comprises at least one audio speaker coupled to the output of the low pass filter.

9. A method for detecting and suppressing analog error associated with an output stage of a class-D amplifier, comprising:
combining a digital input signal with a digital feedback signal to produce a first combined signal;
generating a digital pulse-width modulated (PWM) signal based on the first combined signal and providing the digital PWM signal to a feedback circuit;
generating an analog output signal for driving a load based on the digital PWM signal; and
generating the digital feedback signal using the feedback circuit by:
converting the digital PWM signal to an analog PWM signal,
combining the analog PWM signal and the analog output signal to generate a second combined signal, and
converting the second combined signal to a digital form.

10. The method of claim 9, further comprising:
setting a reference voltage of the DAC and a reference voltage of the ADC to a same value.

11. The method of claim 9, wherein combining the digital input signal with the digital feedback signal comprises:
subtracting the digital feedback signal from the digital input signal.

12. A class-D amplifier, comprising:
a first combiner operable to combine a digital input signal, a first feedback signal, and a second feedback signal to obtain a first combined signal;
a pulse width modulation stage operable to generate a pulse-width modulated (PWM) signal by comparing the first combined signal to a triangle waveform and to provide the PWM signal as the first feedback signal and as an input to a feedback circuit;
an output stage operable to generate an output signal for driving a load responsive to the PWM signal; and
the feedback circuit operable to receive the PWM signal and the output signal from the output stage and to generate the second feedback signal based thereon.

13. The class-D amplifier of claim 12, wherein the PWM signal comprises a digital PWM signal, the output signal comprises an analog output signal, and the feedback circuit comprises:
a digital to analog converter (DAC) operable to convert the digital PWM signal to an analog PWM signal;
a second combiner operable to combine the analog PWM signal and the analog output signal to generate a second combined signal; and
an analog to digital converter (ADC) that is coupled to the second combiner and operable to convert the second combined signal from an analog form to a digital form to generate the second feedback signal.

14. The class-D amplifier of claim 13, wherein the DAC comprises an inverter.

15. The class-D amplifier of claim 13, wherein the second combiner comprises a first resistor, a second resistor, a third resistor, and an operational amplifier,
the first resistor having a first terminal coupled to the output stage and a second terminal coupled to an input of the operational amplifier,
the second resistor having a first terminal coupled to the output of the DAC and a second terminal coupled to the input of the operational amplifier, and
the third resistor having a first terminal coupled to an output of the operational amplifier and a second terminal coupled to the input of the operational amplifier.

16. The class-D amplifier of claim 13, wherein a reference voltage of the DAC and a reference voltage of the ADC are equal.

17. The class-D amplifier of claim 13, wherein the ADC is a sigma-delta ADC.

18. The class-D amplifier of claim 12, wherein the output stage comprises an open loop driver.

19. The class-D amplifier of claim 12, wherein the first feedback signal and the second feedback signal are digital signals.

20. The class-D amplifier of claim 12, further comprising:
a low pass filter coupled to an output of the output stage; and
wherein the load comprises at least one audio speaker coupled to the output of the low pass filter.

* * * * *